United States Patent [19]
Osburn et al.

[11] Patent Number: 5,428,829
[45] Date of Patent: Jun. 27, 1995

[54] METHOD AND APPARATUS FOR TUNING AND ALIGNING AN FM RECEIVER

[75] Inventors: David W. Osburn; John R. Pacourek; Michael J. Easterwood; Stephen L. Inman; Richard A. Kennedy, all of Kokomo, Ind.

[73] Assignee: Delco Electronics Corporation, Kokomo, Ind.

[21] Appl. No.: 952,554

[22] Filed: Sep. 28, 1992

[51] Int. Cl.$^6$ .............................................. H04B 1/16
[52] U.S. Cl. .............................. 455/197.1; 455/193.2; 455/193.3; 455/340
[58] Field of Search ............... 455/183.1, 183.2, 185.1, 455/186.1, 193.1–193.3, 195.1–197.3, 198.1, 199.1, 226.1, 340

[56] References Cited

U.S. PATENT DOCUMENTS

| | | | |
|---|---|---|---|
| 4,402,089 | 8/1983 | Knight et al. | 455/195.1 |
| 4,736,456 | 4/1988 | Maier | 455/197.1 X |
| 5,201,063 | 4/1993 | Tam et al. | 455/226.1 X |

FOREIGN PATENT DOCUMENTS

| | | | |
|---|---|---|---|
| 61-251314 | 11/1986 | Japan | 455/195.1 |
| 63-187718 | 8/1988 | Japan | 455/196.1 |

Primary Examiner—Edward F. Urban
Assistant Examiner—Chi H. Pham
Attorney, Agent, or Firm—Anthony Luke Simon; Jimmy L. Funke

[57] ABSTRACT

A method for tuning and aligning an electronically tuned FM broadcast receiver is described. The system described compensates for the mismatch of component values between the antenna and RF amplifier tuned circuits, and the IF offset between the local oscillator frequency and the center frequencies of the antenna and RF resonant circuits by developing independent tuning signals for the circuits. The system also provides temperature compensation, and can be aligned without mechanically adjusting inductors and/or capacitors in the tuned circuits.

4 Claims, 5 Drawing Sheets

METHOD AND APPARATUS FOR TUNING AND ALIGNING AN FM RECEIVER

This invention relates to digitally controlled FM receivers and more particularly to an improved method and apparatus for a digital FM receiver front end.

BACKGROUND OF THE INVENTION

Most modern receivers employ electronic tuning instead of mechanical tuning, which requires mechanical linkage between the tuning control on the receiver, the local oscillator, the resonant antenna and the RF (Radio Frequency) circuits. Typical modern receivers with electronic tuning include front end circuitry, which provides amplification and frequency selectivity to the RF signal prior to the mixer. The front end circuitry also generates an oscillator signal that has a frequency equal to a fixed Intermediate Frequency (IF) plus the desired FM channel frequency.

The RF and oscillator signal are input to the mixer that translates the desired FM channel signal to the fixed IF signal, which is typically 10.7 MHz. The remainder of the amplification and frequency selectivity prior to the FM detector occurs at this fixed IF.

FIG. 1 shows a basic front end block diagram of a typical electronically tuned FM receiver. The circuitry indicated in FIG. 1 is fairly typical implementation.

FIG. 2 illustrates a basic block diagram of PLL (phase lock loop) 51 comprising frequency synthesizer 50 (also shown in FIG. 1) and VCO (voltage controlled oscillator) 40.

Voltage controlled oscillators such as VCO 40 are well known to those skilled in the art. In general VCO 40 comprises active semiconductor devices and an LC tank, which controls the frequency of oscillation. The exact circuit configuration of the VCO will not be discussed as a variety of circuits known to those skilled in the art can be used.

The majority of the capacitance in the LC tank is achieved using a varactor, which is a semiconductor device with a variable capacitance that is an exponential function of a DC voltage applied to the device. The frequency of VCO 40 is varied by changing the tuning voltage applied to the varactor, which changes its capacitance.

Frequency synthesizer 50 generally comprises amplifier 52, programmable divide by N frequency divider 60, serial port 62, crystal oscillator 68, programmable divide by R frequency divider 70, phase comparator 64 and loop filter 66. The components of the frequency synthesizer are typically included on one IC, but may alternatively be included in a microcomputer IC.

The operating frequency of PLL 51 is controlled by the receiver microcomputer 48 via serial port 62, through which microcomputer-generated control signals program frequency dividers 60 and 70. Crystal oscillator 68 typically operates at a few MHz and provides a crystal reference frequency signal to the input of frequency divider 70. Frequency divider 70 divides the crystal reference frequency by an integer, R, determined by the control signal generated by the microcomputer, to produce the phase comparison frequency. The phase comparison frequency is preferably chosen such that the FM channel spacing is an integer multiple of the phase comparison frequency. The output of frequency divider 70 is connected to one input of the phase comparator 64.

VCO 40 is connected to the input of amplifier 52. Amplifier 52 increases the signal level of the signal output by VCO 40 and provides the resultant signal to the input of frequency divider 60. Frequency divider 60 divides the frequency of VCO 40 by an integer, N, and provides the output to a second input of phase comparator 64.

Phase comparator 64 compares the phases of the signals from frequency divider 60 and frequency divider 70 and produces an output signal proportional to the phase difference between the signals. The output of the phase comparator 64 represents the loop error of the PLL and is connected to the input of loop filter 66.

Loop filter 66 is of a type well known to those skilled in the art and has one of a variety of possible filter transfer functions. The transfer function must yield a stable loop and can generally be varied significantly by those skilled in the art depending on tradeoffs between various loop performance parameters.

The output of the filter 66 is connected to the tuning voltage control of VCO 40 to complete the control loop.

The tuning voltage output of filter 66 forces VCO 40 to change frequency until the phase error at the output of phase comparator 64 is zero. At this point, the loop 51 is locked and frequency output of VCO 40 is equal to N times the phase comparison frequency, which is directly related to the crystal reference frequency, providing high accuracy to the frequency of VCO 40.

Referring again to FIG. 1, the receiver is tuned to a particular FM station via the front panel controls (not shown). These controls are connected as inputs to the receiver microcomputer 48. Microcomputer 48 determines the desired FM channel frequency and sends a serial data string via the IRB (Internal Radio Bus) 49 to the frequency synthesizer 50. The serial data string received by frequency synthesizer 50 programs PLL 51, comprising VCO 40 and frequency synthesizer 50, to the proper frequency as described previously. The output frequency of VCO 40 will be equal to the desired station frequency plus the IF (10.7 MHz). The output of VCO 40 is connected to one input of mixer 34 as shown.

Antenna 12 acts as an RF signal source by receiving a broad range of RF signals including the FM broadcast band and providing the RF signals to the input of antenna tank 14, which is a parallel resonant LC circuit. Antenna tank 14 comprises capacitor 16, inductor 18 and varactor 20 and acts as a bandpass filter having a band pass frequency responsive to the tuning voltage of varactor 20. Inductor 18 is of a type known to those skilled in the art that can be adjusted by mechanically moving the ferrite core. The capacitance of antenna tank 14 is largely determined by varactor 20.

The output of antenna tank 14 is connected to the input of RF amplifier 24. The output of RF amplifier 24 is connected to RF tank 26, which is another band pass filter similar to antenna tank 14 and comprises capacitor 28, inductor 30 and varactor 32. RF tank 26 has a band pass frequency responsive to the tuning voltage of varactor 32. The output of RF tank 26 is connected to the other input of mixer 34. The function of antenna tank 14, RF amplifier 24, and RF tank 26 is to selectively amplify a narrow band of frequencies centered about the desired FM station. This action limits the total RF energy into mixer 34, and prevents image signals from being translated into the IF bandwidth.

The tuning voltage from frequency synthesizer 50 is connected to varactor 46 in VCO 40, and is also connected to varactors 20 and 32 in antenna tank 14 and RF tank 26. Thus, as the tuning voltage output of VCO 40 is changed in order to change the frequency of the VCO 40, the center frequencies of antenna tank 14 and RF tank 26 are also changed. The three varactors 46, 20 and 32, used in VCO 40, antenna tank 14, and RF tank 26, are a matched set having similar voltage versus capacitance characteristics.

If the inductors in these three circuits 14, 26 and 40 are adjusted properly, then the center frequencies of antenna tank 14 and RF tank 26 will equal the output frequency of VCO 40 frequency minus the IF (10.7 MHz), which would also be equal to the desired FM station frequency, and will track the output frequency of VCO 40 as it is tuned across the FM band.

During manufacture of the receiver, inductors 18 and 30 are adjusted to align the receiver in the following manner. First, a signal generator is connected to the receiver at the antenna input. Then the receiver and the signal generator are programmed to a given frequency—generally somewhere near the lower end of the FM band. Inductor 44 in VCO 40 is then mechanically adjusted so that varactor 46 has sufficient tuning range to cover the FM band—typically a tuning range of several volts is required. In practice, inductor 44 is varied until the tuning voltage is equal to a predetermined value at a given output frequency of VCO 40.

The amplitude of the signal generator is set to a value where the receiver AGC (automatic gain control) curve has significant slope. The AGC is a function common to essentially all FM receivers. The detector for this function is located after and/or in the IF amplifier (not shown) of the receiver. The AGC voltage generated by this detector is a function of the on channel carrier amplitude. The AGC curve is generally not completely linear, but should be monotonic, and may have a positive or negative slope depending on the sense of the gain control. The AGC voltage is used to adjust the gain in the RF amplifier and perhaps other stages, as a function of signal strength. The important point is that the AGC voltage is an indicator of signal strength through the IF.

With a known signal frequency and amplitude into the receiver input, inductors 18 and 30 in antenna tank 14 and RF tank 26 are adjusted by mechanically moving the ferrite cores so that the signal through the IF is maximized, as indicated by the AGC voltage.

Antenna tank 14 and RF tank 26 are thus aligned such that their center frequencies are correct at one frequency in the FM band. This type design then depends on the varactor characteristics matching well enough that the center frequencies of antenna tank 14 and RF tank 26 will properly track VCO 40 as it is tuned across the band. In practice, the bandwidth of antenna tank 14 and RF tank 26 are wide enough that the tracking errors do not cause serious receiver performance problems.

The mechanical alignment of the inductors is generally accomplished in one of two ways. Manufacturing personnel can physically adjust the inductors by hand using a small hand tool, or the inductors can be adjusted at an automatic alignment station. An automatic alignment station is fairly sophisticated electronic/mechanical apparatus that locates and rotates the inductor cores, while monitoring the necessary electronic signals.

There are some performance limitations of the system described above, including some error in tracking due to the IF offset and varactor mismatch. VCO 40 must be tuned from 98.8 to 118.6 MHz to cover the FM band, while antenna tank 14 and RF tank 26 must be tuned from 88.1 to 107.9 MHz. While the tuning range is 19.8 MHz in both cases, the percent change is different. Since the tuning voltage applied to the varactors is identical, this creates some error as the receiver is tuned far away from the alignment point.

There is also some mismatch between the varactors 20, 32 and 46, even though matched sets are used. Each set of varactors is taken from one classification, but each classification represents a range of capacitance versus voltage characteristics. Therefore all varactors within a set are not identical. The tracking can be improved somewhat by adding more adjustable components to the tank circuits, and aligning at more points on the band, but such designs and procedures yield only marginal improvements in tracking. Therefore, design techniques similar to those described are usually used.

The tracking errors described above cause the front end band pass filter center frequencies to vary from the desired station frequency across the FM band. This will cause some loss of sensitivity and increase the total harmonic distortion. While the performance degradation due to tracking error is generally not serious, receiver performance will improve if this tracking error is reduced. The mechanical alignment of the inductors used in this system is also a significant cost item, either in direct labor or investment in automatic alignment equipment.

SUMMARY OF THE PRESENT INVENTION

The objective of this invention is to address both the tracking error of the front end band pass filters and the cost of mechanical alignment of the band pass filter inductors by providing a system that improves the tuning accuracy, and also eliminates the need for mechanical alignment.

According to this invention, the VCO tuning voltage is no longer connected directly to the antenna tank and RF tank varactors. Instead, two separate tuning voltages are generated for the RF tank and the antenna tank as linear multiples of the VCO tuning voltage plus a temperature compensation term. The tuning voltages are controlled by a microcomputer to provide accurate band pass center frequencies for the selected radio channel.

The appropriate tuning voltages are predetermined during an alignment procedure and signals representative of the appropriate tuning voltages are preprogrammed into computer memory. The preprogrammed signals may correspond to a few points along the FM band, from which interpolations are made for each desired channel selection.

This method and apparatus of this invention eliminate the need for mechanically adjusting the inductors in the resonant circuits. The RF tank and antenna tank tuning voltages are still a function of the VCO tuning voltage and thus change value as the VCO tuning voltage changes; however, the tuning voltages are also independently adjusted to compensate for component tolerances and the IF offset. In this manner the apparatus and process of this invention provides better tracking accuracy than can be achieved by using the same tuning voltage for all three resonant circuits.

In an FM radio front end, the method of this invention comprises the steps of (i) receiving a control signal for selection of an FM channel; (ii) providing a VCO tuning voltage responsive to the control signal; (iii) developing a first tank tuning voltage responsive to the VCO tuning voltage and a first predetermined offset value; and (iv) developing a second tank tuning voltage in response to the VCO tuning voltage and a second predetermined offset value.

The apparatus of this invention comprises:

a first tank having a band pass frequency responsive to a first tank tuning voltage, the first tank having a first tank input coupled to an RF signal source and having a first tank output;

a second tank having a band pass frequency responsive to a second tank tuning voltage, the second tank having a second tank input coupled to the first tank output and having a second tank output;

a VCO responsive to a VCO tuning voltage and having a VCO output;

means for mixing the second tank output and VCO output to provide an IF signal;

means for receiving a control signal for selection of an FM channel;

means for providing the VCO tuning voltage responsive to the control signal;

means for providing the first tank tuning voltage responsive to the VCO tuning voltage and a first predetermined gain value, providing the first tank with accurate tracking of the selected FM channel; and means for providing the second tank tuning voltage responsive to the VCO tuning voltage and a second predetermined gain value, providing the second tank with accurate tracking of the selected FM channel.

The apparatus and method of this invention, along with its advantages are set forth in more detail below.

DETAILED DESCRIPTION OF THE INVENTION

The invention described relates to front end circuitry of an FM receiver prior to the IF circuitry. Radio portions from the IF stage to the audio output are not affected by this invention and are not set forth in detail with the understanding that conventional radio circuitry well known to those skilled in the art is used in these unaffected portions.

Figure 2:
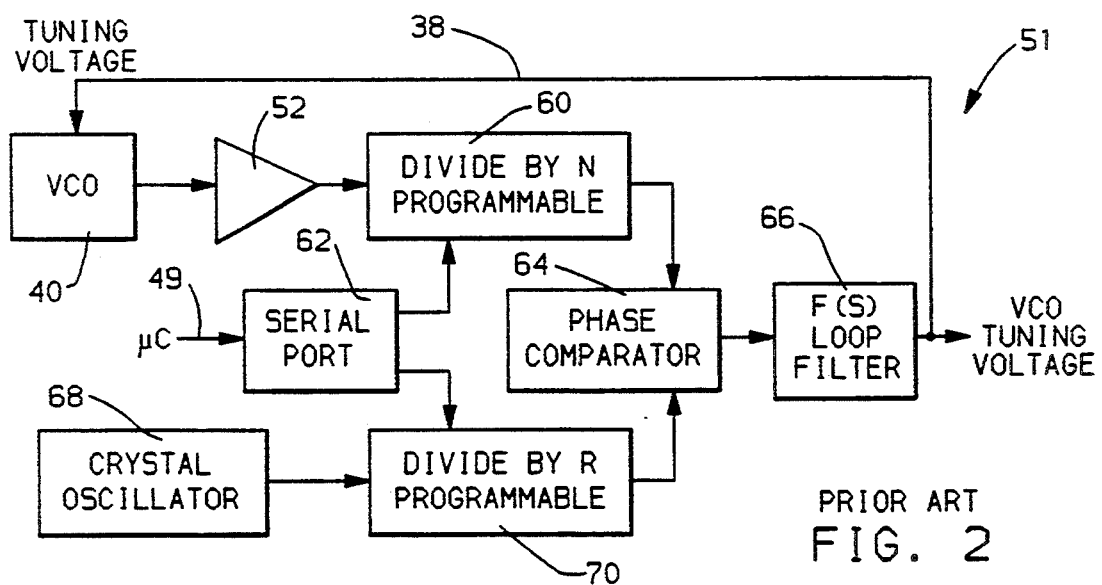
Figure 3A:
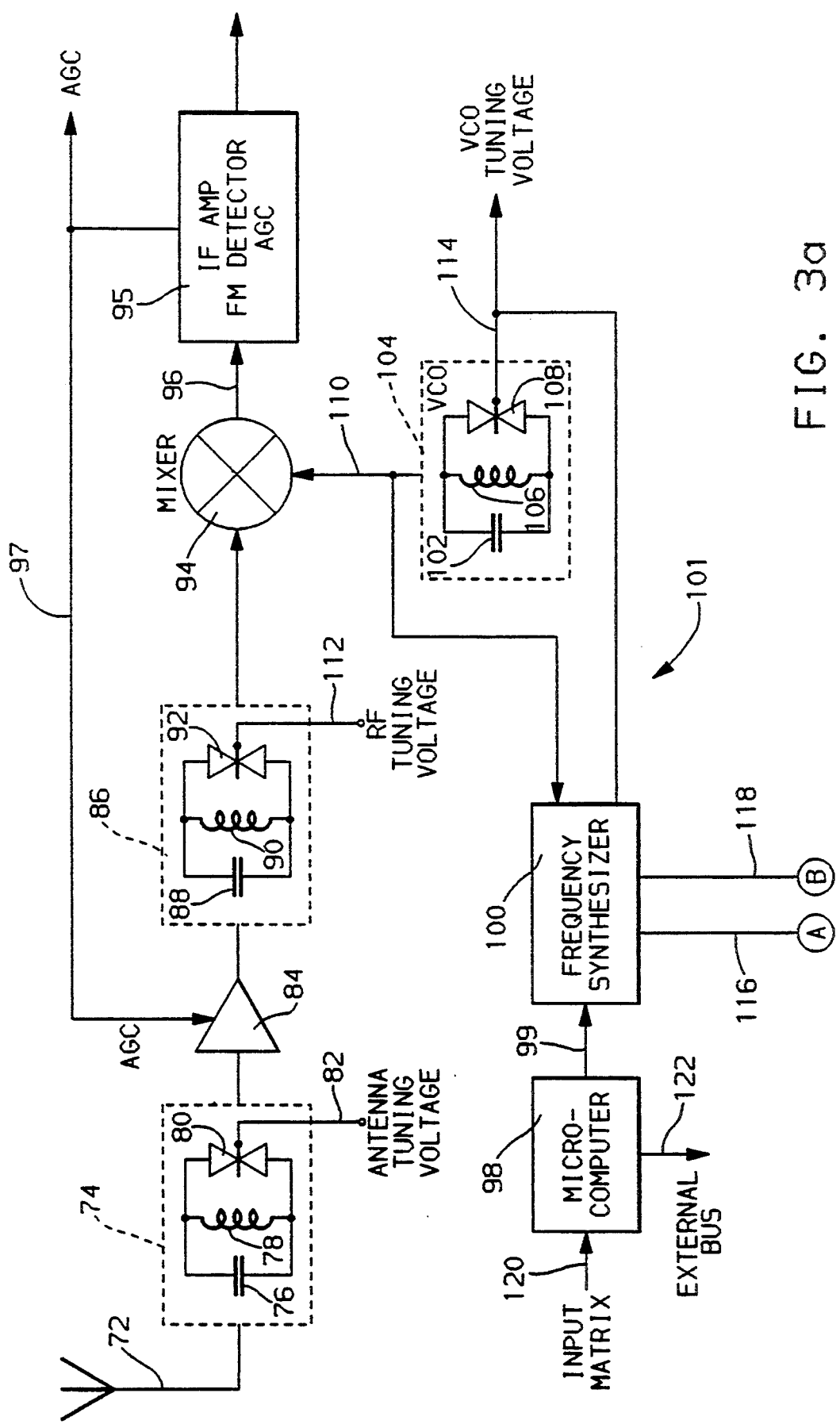
FIGS. 3a and 3b comprise a schematic diagram of an apparatus for RF to IF conversion according to this invention.
Figure 3B:
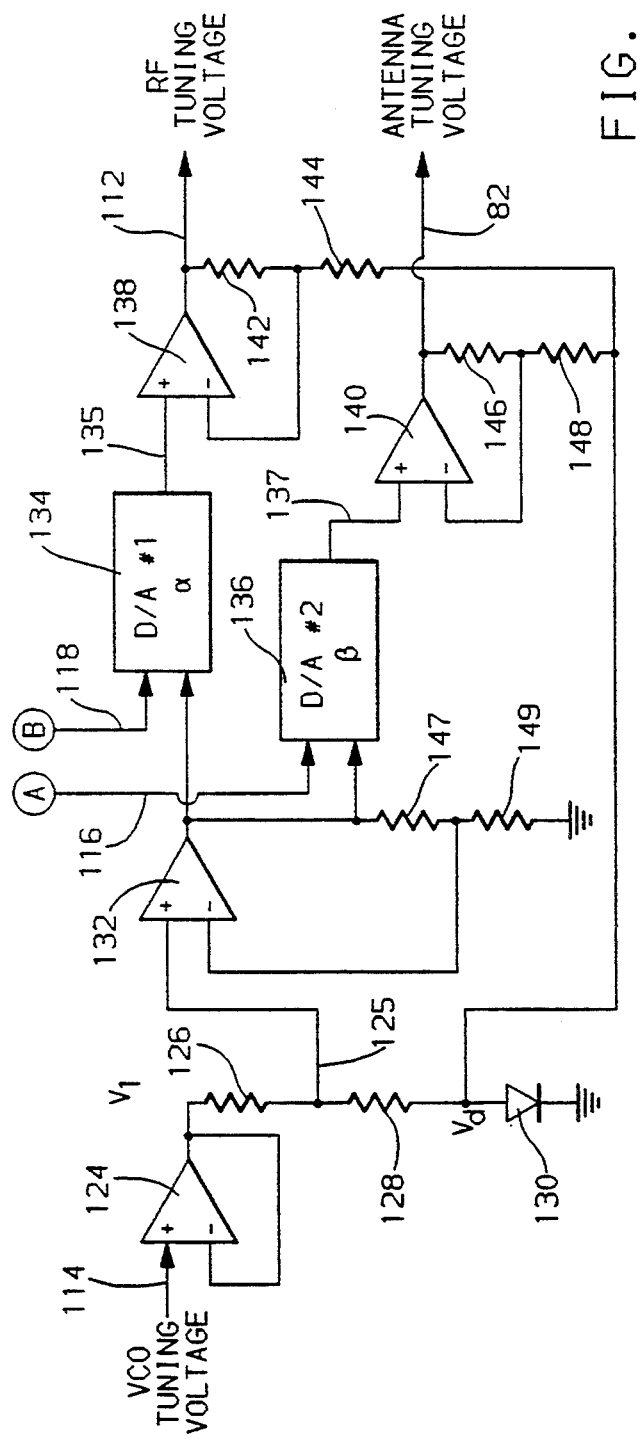
Figure 4:
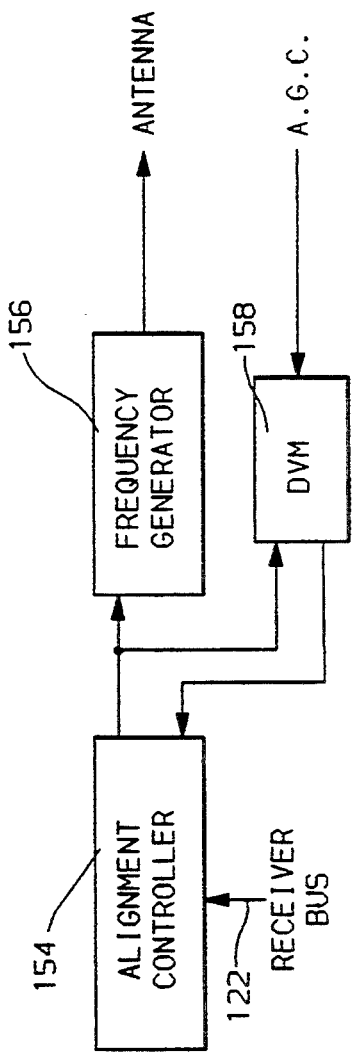
FIG. 4 is a schematic diagram of an apparatus for tuning and aligning an FM receiver according to this invention.

Referring now to FIGS. 3a, 3b and 4, FIG. 3a includes components similar to those described above with reference to FIGS. 1 and 2: antenna 72 (RF signal source); antenna tank 74 (first tank resonant circuit) including capacitor 76, inductor 78 and varactor 80, and having a band pass frequency responsive to the tuning voltage of varactor 80; RF amplifier 84; RF tank 86 (second tank resonant circuit) including capacitor 88, inductor 90 and varactor 92 and having a band pass frequency responsive to the tuning voltage of varactor 92; mixer 94; VCO 104 including capacitor 102, inductor 106 and varactor 108; microcomputer 98; and frequency synthesizer 100. The circuitry in FIG. 3b includes amplifiers 124, 132, 138 and 140, resistors 126, 128, 142, 144, 146, 147, 148 and 149, diode 130, and D/A converters 134 and 136. In FIG. 4, the equipment necessary to align the receiver circuitry of FIGS. 3a and 3b includes controller 154, frequency generator 156 and meter 158.

The receiver circuitry of FIGS. 3a and 3b generally operates in two modes, alignment mode and tuning mode, both of which are controlled by microcomputer 98.

According to this invention, the VCO tuning voltage on line 114 is not connected directly to the antenna rank and RF tank varactors 80 and 92. Instead, the circuit of this invention operates so that the RF and antenna tuning voltages generated at lines 112 and 82 and connected to varactors 92 and 80 are a linear multiple of the VCO tuning voltage at line 114 plus a temperature compensation term.

Figure 1:
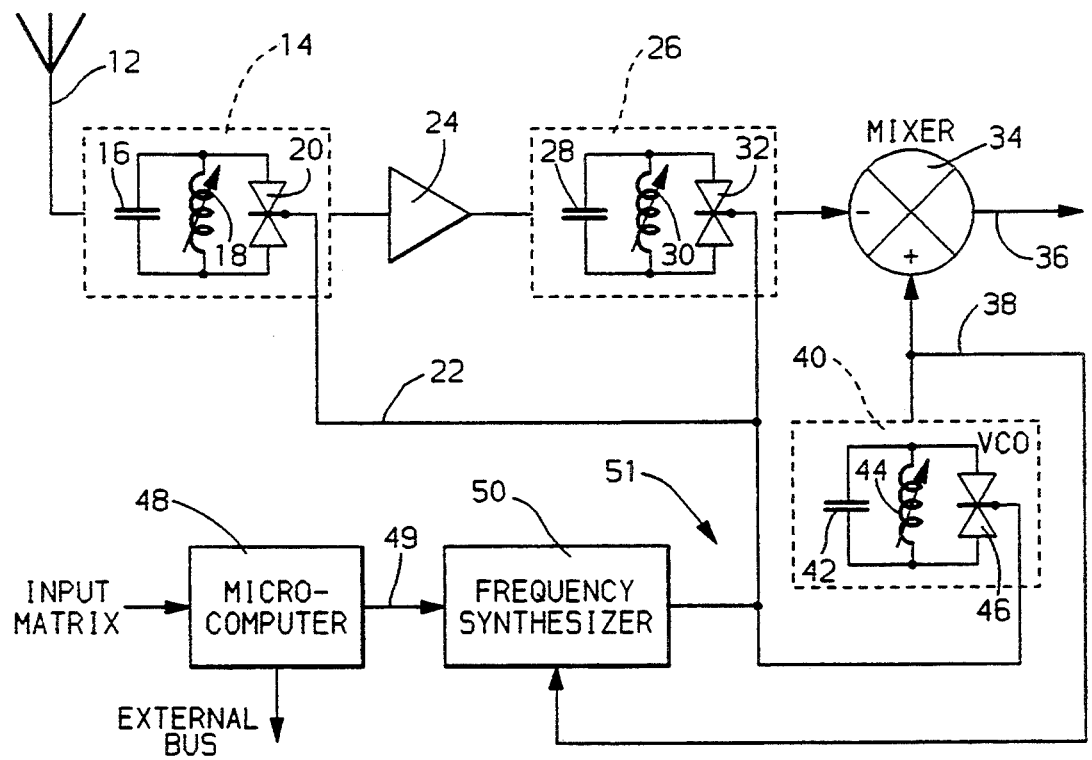
FIGS. 1 and 2 comprise a schematic diagram of typical RF to IF circuitry for a digitally controlled radio.

The VCO tuning voltage on line 114 is developed by PLL 101 (comprising frequency synthesizer 100 and VCO 104) in response to control signals from microcomputer 98 in the same manner that the VCO tuning voltage is generated on line 38 in FIGS. 1 and 2. Microcomputer 98 receives control signals from an operator interface for radio station selection in a manner well known to those skilled in the art.

Instead of providing the VCO tuning voltage to the RF and antenna tank varactors as done in FIGS. 1 and 2, the VCO tuning voltage on line 114 is provided to the circuit shown in FIG. 3b.

The VCO tuning voltage on line 114 is provided to amplifier 124, which acts as a buffer. The output of amplifier 124 is connected to resistors 126 and 128, which are connected as a voltage divider in series with diode 130. The voltage on line 125, the output of the voltage divider is:

$$V_{125} = (V_1 + V_d)/2, \quad (1)$$

where $V_1$ is the output of amplifier 124, $V_d$ is the voltage drop across diode 130 and $V_{125}$ is the voltage on line 125. $V_d$ varies with temperature and affects the temperature compensation of the circuit in the manner described further below.

The output of the voltage divider on line 125 is provided to amplifier 132, which amplifies the signal on line 125, e.g., by a gain of two, and which also acts as a buffer. The output of amplifier 132 is provided to D/A converter 134 and to D/A converter 136. D/A converters 134 and 136 act as programmable voltage dividers controlled by microcomputer 98 through lines 116 and 118. The digital input of D/A converter 134 is controlled by first predetermined commands from microcomputer 98 through bus 118 and the positive reference input of D/A converter 134 is connected to the output of amplifier 132. Similarly, the digital input of D/A converter 136 is controlled by second predetermined commands from microcomputer 98 through line 116 and the positive reference input of D/A converter 136 is connected to the output of amplifier 132. In this manner, the analog outputs of D/A converters 134 and 136 are linear multiples of the output of amplifier 132. The output of D/A converter 134 is equal to the VCO tuning voltage signal multiplied by a first constant as determined by the signal on bus 118 and the output of D/A converter 136 is equal to the VCO tuning voltage signal multiplied by a second constant as determined by the signal on bus 116. The gains of D/A converters 134 and 136 are variable from 0.000 to 0.996 in 256 discrete steps, as controlled by microcomputer 98 via the serial port in frequency synthesizer 100 and the gain command signals on busses 116 and 118.

The signal output from D/A converter 134 is equal to:

$$V_{135} = \alpha(V_1 + V_d), \qquad (2)$$

where $\alpha$ is the programmable gain of D/A converter 134 and $V_{135}$ is the voltage on line 135. The output signal of D/A converter 136 is equal to:

$$V_{137} = \beta(V_1 + V_d), \qquad (3)$$

where $\beta$ is the programmable gain of D/A converter 136 and $V_{137}$ is the voltage on line 137.

The outputs of D/A converters 134 and 136 are connected to the input of amplifiers 138 and 140. Amplifiers 138 and 140 are both DC referenced to $V_d$, the voltage drop across diode 130. The values of resistors 142 and 144 are equal and the values of resistors 146 and 148 are equal, such that the output of amplifier 138 on line 112 ($V_{112}$) equals:

$$V_{112} = 2\alpha(V_1 + V_d) - V_d, \qquad (4)$$

where $V_{112}$ is the RF tuning voltage, and such that the output of amplifier 140 on line 82 equals:

$$V_{82} = 2\beta(V_1 + V_d) - V_d, \qquad (5)$$

where $V_{82}$ is the antenna tuning voltage on line 82.

With the parameters shown, the gains $2\alpha$ and $2\beta$ can be varied from 0.000 to 1.992, providing sufficient adjustability to tune the RF tank 86 and antenna tank 74 over the required range.

The circuit implementations for the D/A converters and the amplifiers can be any suitable implementations well known to those skilled in the art. In general, it is preferred that the D/A converters are monotonic. A high degree of linearity is not necessary and the gain and offset errors should be minimized. Some error will be accounted for in the alignment procedure described further below. The output impedance of amplifier 132 is preferably very small in order to prevent the changing load impedance of the D/A converters 134 and 136 from modulating the output of amplifier 132.

Temperature Compensation

The temperature compensation in the circuit shown contributes to the circuit performance and is explained as follows.

The capacitance of varactor 108 in VCO 104 is defined as:

$$C_{108} = C_o (V_{108} + f)^d, \qquad (6)$$

where Co, f (the varactor junction voltage), and d are constants defined by the varactor process, and $V_{108}$ is the tuning voltage of varactor 108. The capacitance of varactor 92 in RF tank 86 is similarly defined as:

$$C_{92} = C_o (V_{112} + f)^d, \qquad (7)$$

where $C_{92}$ is the capacitance of varactor 92 and $V_{112}$ is the tuning voltage of varactor 92, defined in equation (4) above. Combining equations (7) and (4), the capacitance of varactor 92 can be rewritten as follows:

$$C_{92} = C_o[2\alpha(V_1 + V_d) - V_d + f]^d. \qquad (8)$$

$V_1$ equals the tuning voltage of capacitor 108 on line 114 since amplifier 124 has a gain of 1.

Assuming that the forward biased junction voltage of silicon diode 130 is equal to the silicon varactor junction voltage, which is a close approximation, then it can be shown that equation (8) simplifies to:

$$C_{92} = C_{108}(2\alpha)^d. \qquad (9)$$

Similarly, the capacitance for varactor 80 ($C_{80}$) in antenna tank 74 can be written as:

$$C_{80} = C_{108}(2\beta)^d. \qquad (10)$$

$C_{80}$ and $C_{92}$ are thus equal to $C_{108}$ multiplied by a programmable gain term (($2\alpha)^d$ or $(2\beta)^d$), which is temperature independent, illustrating that the temperature coefficients of all three varactors 80, 92 and 108 are equal. The operating frequency of VCO 104 is forced by PLL 101 to be a-multiple of the crystal oscillator (not shown, but similar to reference 68, FIG. 2)) within frequency synthesizer 100. Thus, as $C_{108}$ changes as a function of temperature at a given tuning voltage, PLL 101 adjusts the tuning voltage in order to force the capacitance back to the original value, forcing, for a given operating frequency, $C_{108}$ to be constant independent of temperature. Since $C_{80}$ and $C_{92}$ are multiples of $C_{108}$, they are also constant over temperature.

It is assumed that the temperature coefficients of inductors 78, 90 and 106 are very small, and that varactors 80, 92 and 108 are all operating at the same temperature. Even if the temperature coefficients of inductors 78, 90 and 106 are not negligible, this system will tend to cancel their effects so long as they are of similar value. In practice, the temperature compensation of this circuit is very effective.

The above explanation illustrates the importance of diode 130. Adding the diode voltage, $V_d$, to the VCO tuning voltage prior to the variable multiplier (D/A converters 134 and 136) cancels the temperature coefficient of the VCO tuning voltage. When the diode voltage, $V_d$, is then subtracted from the tuning voltages on lines 112 and 82 at the outputs of Amplifiers 138 and 140, the tuning voltages are provided with the same temperature coefficient as the VCO tuning voltage on line 114, independent of the multiplier values.

Alignment

When a radio receiver in which this invention is incorporated is tuned by an operator, the microcomputer 98 programs the frequency synthesizer 100 to the proper frequency in the conventional manner. For each channel frequency, the microcomputer 98 also programs a value for each D/A converter 134, 136. This generates the proper tuning voltages to set the center frequency of RF tank 86 and antenna tank 74 to the correct channel. The multiplier values of D/A converters 134 and 136 are determined during an alignment procedure, before the receiver is installed in a vehicle.

During the alignment procedure, microcomputer 98 controls the circuitry shown in FIGS. 3a and 3b and also communicates with external alignment controller 154 via a digital bus 122. Alignment is preferably done at the top and bottom of the FM band and at one or more points in the middle of the band.

Alignment controller 154 controls external frequency generator 156 and digital volt meter 158. Alignment controller 154 initiates the alignment procedure by sending a message to microcomputer 98, which responsively programs frequency synthesizer 100 to a predetermined frequency. Alignment controller 154 programs the proper frequency and amplitude of the frequency generator 156, which is connected to the receiver antenna input, Alignment controller 154 then sends signals to microcomputer 98 so that the programming values for D/A converters 134 and 136 are varied to maximize the IF signal level as indicated by the automatic gain control voltage signal, AGC, on line 97. (Automatic gain controls are well known to those skilled in the art of radio receivers.)

The receiver AGC signal is monitored by digital volt meter 158, which sends this information to alignment controller 154. The programming values of D/A converters 134 and 136 are then automatically programmed into the memory of microcomputer 98.

The software that controls the above procedure is partitioned between the microcomputer 98 and alignment controller 154 and information is shared between the two computers via bus 122. This software can be partitioned in various ways, which are matter of preference. The frequency tuned by the receiver is coordinated with frequency generator 156, and the peak signal is determined from the AGC information by one of the computers. The alignment at that frequency is stopped once the peak signal is determined and the program values for D/A converters 134 and 136 are stored in microcomputer 98. The procedure is then repeated for as many alignment points as desired. Good tracking accuracy can be achieved with three or four alignment points.

Figure 5A:
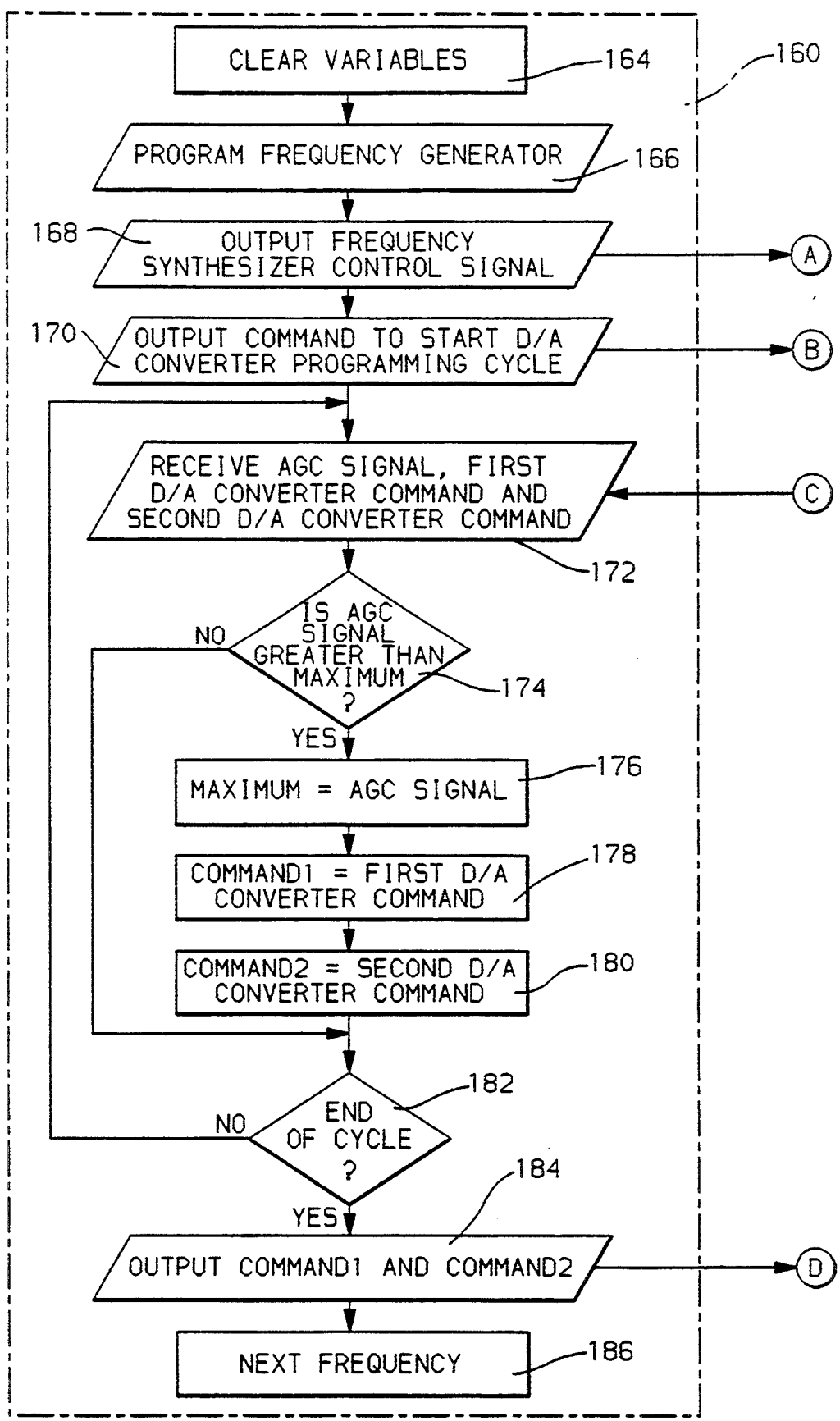
FIGS. 5a and 5b illustrates a flow diagram for front end alignment of a receiver according to this invention.
Figure 5B:
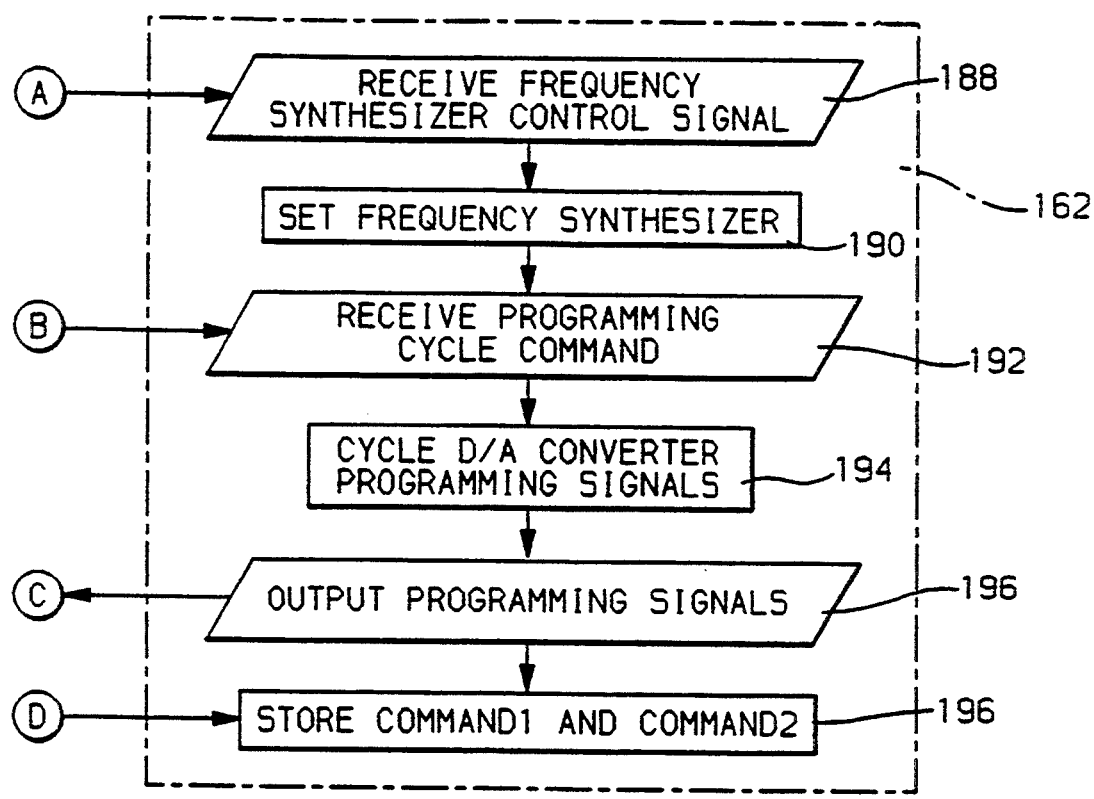

FIGS. 5a and 5b illustrates a flow routine for one possible implementation of control software for the alignment operation discussed above. In general, block 160 represents control commands programmed in alignment controller 154 and block 162 represents control commands programmed in microcomputer 98. In the example, the control routine is initialized in the alignment controller by clearing all of the variables at block 164. At block 166, the frequency generator 156 is programmed to the test frequency and at block 168, a command control signal is output to the microcomputer 98 to set the synthesizer frequency.

At block 188, microcomputer 98 receives the frequency synthesizer control signal and at block 190 microcomputer 98 sets frequency synthesizer 190 in response to the received control signal.

At block 170, alignment controller 154 outputs a command to start the programming cycle for the D/A converter commands.

At block 192, microcomputer 98 receives the start command from alignment controller 154 and at block 194 begins cycling the control inputs for D/A converters 134 and 136. At block 196, microcomputer 98 outputs the programming signals for the D/A converters as they are cycled.

Alignment controller 172 receives the AGC signal from digital volt meter 158 and the programming signals (signal values on buses 116 and 118) from microcomputer 98 at block 172. At block 174, the AGC signal is compared to a variable MAXIMUM. If AGC is not greater than MAXIMUM, the routine jumps to block 182. If the AGC signal is greater than MAXIMUM, then at block 176, MAXIMUM is set to the AGC signal and at block 178 and 180, the variables COMMAND1 and COMMAND2 are set equal to the received D/A converter commands. At block 182, alignment controller 154 determines if the cycling of the D/A converter commands is completed. If the cycling routine is not completed, the routine returns to block 172.

At block 184, alignment controller 154 outputs stored COMMAND1 and COMMAND2 variables, representing the variables at which the AGC signal was maximized. Microcomputer 98 receives these variables and stores them in internal memory as the alignment values for the frequency tested.

At block 186, alignment controller 154 selects the next frequency for alignment, sets MAXIMUM, COMMAND1 and COMMAND2 equal to zero and returns to block 164. If four frequencies are used for alignment, the frequencies used are the bottom and top FM band frequencies, and two additional FM band frequencies approximately equally spaced between the bottom and top frequencies.

Operation

While operating in the normal tuning mode, microcomputer 98 determines the proper D/A converter commands values based on the alignment values stored. For each frequency selected by an operator, microcomputer 98 determines the D/A converter commands by linear interpolation between the alignment values stored for the alignment frequencies above and below the frequency being tuned. The commands are determined separately for D/A converter 134 and D/A converter 136, which are used to generate the RF tuning voltage and antenna tuning voltage, respectively. In this manner, the alignment values stored for the alignment frequencies constitute predetermined variables from which the D/A converter commands serving as the gain commands are developed.

The system provided by this invention eliminates the need for mechanically adjusting the inductors in the resonant circuits. Consequently, the adjustable inductors used in the prior art can be replaced with less expensive fixed inductors.

According to this invention, the RF and antenna tuning voltages are still a function of the VCO tuning voltage and thus change value as the VCO tuning voltage changes. However, the D/A command values can be independently adjusted to compensate for component tolerances and the IF offset. This results in better tracking accuracy than can be achieved by using the same tuning voltage for all three resonant circuits.

The implementations shown are example implementations of this invention and programmable DC tuning voltages for the varactors (80, 92 108) can be generated in a number of ways. There are several advantages to the particular method chosen here.

A simplistic method would be to use a fixed DC reference followed by a programmable gain stages. The gains for each output could be varied to produce the tuning voltages needed to correctly tune the resonant circuits for a given channel frequency. The tuning voltages needed for RF tank 86 and antenna tank 74 would be determined independently from the VCO tuning voltage. However, the voltage versus frequency function for a varactor tuned parallel resonant circuit is a concaved downward curve. To accurately produce such a curve, many alignment points would be needed to break the curve into short line segments, or a complicated algorithm would be needed to calculate the points in between alignment points. Since the components in the three resonant circuits are similar, the voltage versus frequency curves will be similar in shape. There may be an offset between the curves, or they may have somewhat different slopes, but the basic shape should be the same.

In the preferred circuit shown in FIGS. 3a and 3b, the VCO tuning voltage is used as the input reference. Thus, the RF and antenna tuning voltages outputs from amplifiers 138 and 140 are a linear function of the VCO tuning voltage. By adjusting the gain of the two different paths at the alignment points, and interpolating the gain in-between alignment points, the desired voltage versus frequency curves can accurately be produced using only a few alignment points (3–4).

The circuit shown takes advantage of the fact that RF tank 86 and antenna tank 74 behave in a similar manner as VCO 104 as the varactor bias voltage is varied. The respective gains are varied over the frequency band to account for component tolerances and the IF offset. The circuit used minimizes the number of alignment points needed and allows a simple algorithm for calculating the D/A converter command values in between alignment points. This minimizes the burden (Program ROM, EEPROM, and through put) on microcomputer 98, and minimizes the alignment time needed in the manufacturing process.

Experimental data indicates that the tuning of this system, across the FM band and over temperature, is more accurate than a conventional system.

Figure 6:
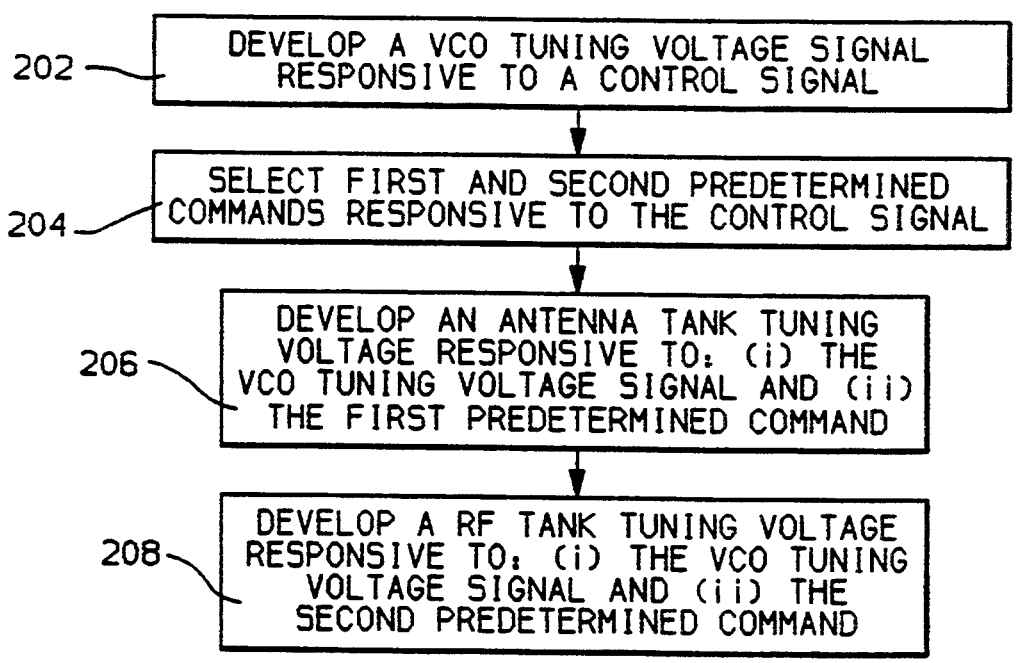
FIG. 6 illustrates an example of the method of this invention.

Referring to FIG. 6, the method of tuning a radio front end according to this invention, as implemented in the above described apparatus, generally comprises the steps of: (i) developing a VCO tuning voltage signal responsive to a control signal (block 202); (ii) selecting first and second predetermined commands responsive to the control signal (block 204); (iii) developing an antenna tank tuning voltage responsive to: (iii.i) the VCO tuning voltage signal and (iii.ii) the first predetermined command (block 206); (iv) developing a RF tank tuning voltage responsive to: (iv.i) the VCO tuning voltage signal and (iv.ii) the second predetermined command (block 208).

The circuitry illustrated above for FIGS. 3a and 3b can be integrated together with frequency synthesizer 100 on a single IC. This circuitry shown requires approximately 4 sq. mm of silicon area in addition to the frequency synthesizer circuitry. The additional Program ROM and EEPROM needed for the tuning and alignment functions are available within standard microcomputers of the type commonly used in FM receivers.

The system described uses external digital volt meter 158 to monitor the receiver AGC voltage. This voltage could also be monitored internal to the receiver using an A/D converter. Some microcomputers are available with internal A/D converters. An external A/D converter could also be used and controlled by microcomputer 98. However, this may require additional I/O ports. Preferably, a twelve bit A/D converter is used. Either implementation, the A/D converter or the digital volt meter 158 is acceptable as they are considered equivalent alternatives for performing the same functions.

Advantages of this invention include the use of separate tuning voltages to tune RF tank 86 and antenna tank 74, with the tuning voltages controlled by the system microcomputer 98. Advantageously, this allows the system to be aligned and tuned without adjusting the inductors in the resonant circuits.

The cost of implementing this technique is primarily determined by the additional silicon area needed for the voltage generation blocks in FIG. 3b. In addition, the inductors used must be accurate within a few percent. The range of tuning voltages that can be generated is limited by the power supply voltage available in the system (typically 9.5 Volts). The inductors must be reasonably accurate in order to limit the range of tuning voltages needed to tune the resonant circuits to the proper frequency. Inductors can be purchased with 3 percent tolerance for a small premium. These costs are more than offset by the savings realized by eliminating mechanical alignment. There are additional manufacturing advantages of software alignment versus mechanical alignment. The software alignment can be done after the receiver is completely assembled and it can be done at the same station as final test.

The above illustrations are examples of this invention. Various improvements and modifications to this invention may occur to those skilled in the art and will fall within the scope of this invention as set forth below.

The embodiments of the invention in which an exclusive property or privilege is claimed are defined as follows:

1. A method for tuning an FM receiver front end including at least one tank resonant circuit and one VCO, comprising the steps of:

receiving a control signal indicative of a desired FM channel frequency;

developing a VCO tuning voltage signal responsive to the control signal;

applying the VCO tuning voltage signal to a series circuit including a diode to develop a voltage drop across the diode;

developing at least one gain command responsive to (i) the control signal and (ii) at least one predetermined variable; and developing a tank tuning voltage for the tank resonant circuit responsive to (i) the VCO tuning voltage signal, (ii) the gain command, and (iii) the voltage drop across the diode, wherein the tank tuning voltage equals the VCO tuning voltage plus the voltage drop across the diode multiplied by the gain command reduced by the voltage drop across the diode to provide the tank tuning voltage with a temperature coefficient substantially equal to that of the VCO tuning voltage.

2. A method for tuning an FM receiver front end, comprising the steps of:

receiving a control signal indicative of a desired FM channel frequency;

developing a VCO tuning voltage signal responsive to the control signal;

applying the VCO tuning voltage signal to a series circuit including a diode to develop a voltage drop across the diode;

developing first and second gain commands responsive to the control signal and at least one predetermined variable;

developing a first tank tuning voltage for the first tank resonant circuit based upon (i) the VCO tuning voltage signal, (ii) the first gain command, and (iii) the voltage drop across the diode, to provide accurate tracking of the first tank resonant circuit to the desired FM channel frequency independent of temperature; and developing a second tank tuning voltage for a second tank resonant circuit based upon (i) the VCO tuning voltage signal, (ii) the second gain command, and (iii) the voltage drop across the diode, to provide accurate tracking of the second tank resonant circuit to the desired FM channel frequency independent of temperature.

3. In an FM radio front end, a method comprising the steps of:
(i) receiving a control signal for selection of an FM channel;
(ii) providing a VCO tuning voltage responsive to the control signal;
(iii) applying the VCO tuning voltage to a series circuit including a diode to develop a voltage drop across the diode;
iv) developing a first tank tuning voltage based upon the VCO tuning voltage, a first predetermined gain value, and the voltage drop across the diode; and
v) developing a second tank tuning voltage based upon the VCO tuning voltage, a second predetermined gain value, and the voltage drop across the diode wherein the voltage drop across the diode compensates the first and second tank tuning voltages such that tracking of the FM channel is independent of temperature.

4. A radio front end apparatus, comprising:
a controller outputting first, second, and third control signals;
a first amplifier having a first input receiving the VCO tuning voltage and having a first output;
a series circuit comprising a resistor divider circuit and a diode in series, the series circuit having a first end coupled to the output of the first amplifier, a second end connected to ground, and a divider output;
a second amplifier having a second input connected to the divider output and having a second output;
a first D/A converter receiving the second control signal and connected to the second output of the second amplifier, the first D/A converter providing a first multiplier output signal having a value equal to the VCO tuning voltage multiplied by a first gain value plus a voltage drop across the diode multiplied by the first gain value, the first gain value being controlled by the second control signal;
a second D/A converter receiving the third control signal and connected to the second output of the second amplifier, the second D/A converter providing a second converter output signal having a value equal to the VCO tuning voltage multiplied by a second gain value plus the voltage drop across the diode multiplied by the second gain value, the second gain value being controlled by the third control signal;
a third amplifier having an third input receiving the first converter output and developing a first tank tuning voltage essentially equal to twice the first converter output signal reduced by the voltage drop across the diode; and
a fourth amplifier having a fourth input receiving the second converter output signal and developing a second tank tuning voltage essentially equal to twice the second converter output signal reduced by the voltage drop across the diode.

* * * * *